(12) United States Patent
Boos

(10) Patent No.: US 8,145,157 B2
(45) Date of Patent: Mar. 27, 2012

(54) HIGH EFFICIENCY MODULATION

(75) Inventor: Zdravko Boos, Munich (DE)

(73) Assignee: Infineon Technologies AG, Neubiberg (DE)

( * ) Notice: Subject to any disclaimer, the term of this patent is extended or adjusted under 35 U.S.C. 154(b) by 742 days.

(21) Appl. No.: 12/241,086

(22) Filed: Sep. 30, 2008

(65) Prior Publication Data

US 2010/0081401 A1    Apr. 1, 2010

(51) Int. Cl.
*H01Q 11/12*    (2006.01)
*H04K 3/00*    (2006.01)

(52) U.S. Cl. .................................. 455/127.1; 332/109

(58) Field of Classification Search .... 455/127.1–127.2; 332/109–116; 375/238
See application file for complete search history.

(56) References Cited

U.S. PATENT DOCUMENTS

| 7,260,368 | B1 * | 8/2007 | Blumer | 455/108 |
| 2008/0019459 | A1 * | 1/2008 | Chen et al. | 375/297 |
| 2008/0214135 | A1 * | 9/2008 | Muhammad | 455/296 |
| 2009/0117864 | A1 * | 5/2009 | Cassia et al. | 455/127.1 |

* cited by examiner

*Primary Examiner* — Lee Nguyen
(74) *Attorney, Agent, or Firm* — SpryIP, LLC

(57) ABSTRACT

This disclosure is directed to techniques for increasing the power efficiency of a modulator.

18 Claims, 2 Drawing Sheets

HIGH EFFICIENCY MODULATION

BACKGROUND

A modulator is arranged in a device for signal transmission, such as used in systems for wireless or wireline communication. One of the functions of a modulator is to modulate a useful signal representing an information to be transmitted onto a carrier frequency signal so to provide a transmission signal. The transmission signal is amplified before being provided to a transmission channel. In case of a base-station of a mobile communication system, the amplifier has to provide for a high amplification gain.

Generally, in mobile communication systems, diverse modulation schemes allowing for a high bandwidth are provided, such as EDGE (Enhanced Data Rates for GSM Evolution), UMTS (Universal Mobile Telecommunication System), etc. These modulation schemes usually provide a non-constant envelope of the transmission signal. This may be due to an amplitude modulation of the transmission signal. The amplitude modulation carries part of the information transmitted. In consequence, the gain control range requirement may be as high as 80 dB or more. In such systems it is very difficult to keep high power efficiency in the whole dynamic range. It is well known, that at very low power levels efficiency drops to only a few percent.

For these and other reasons, there is a need for the present invention.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

This disclosure is directed to techniques for increasing the power efficiency of a modulator. More particularly, the techniques involve implementation of a transmission device and of a modulator. The disclosed apparatus' can be implemented in a variety of communication devices or systems. For example, a transmission device or a modulator can be implemented in mobile phones, base stations, etc. The following systems and methods are described with reference to a mobile communication system; however, it will be appreciated that the disclosed transmission devices and modulators can be implemented generally in any electronic communication system.

The techniques described herein may be implemented in a number of ways. Exemplary environments and contexts are provided below with reference to the included figures and ongoing discussion.

Exemplary Systems

One embodiment is provided, having an RF DAC modulator and DC/DC converter to adeptly control the supply voltage injected into the modulator. The output voltage of the DC/DC converter is controlled by a programmable gain control signal in order to achieve adaptive current and power supply voltage versus output signal.

Figure 1:
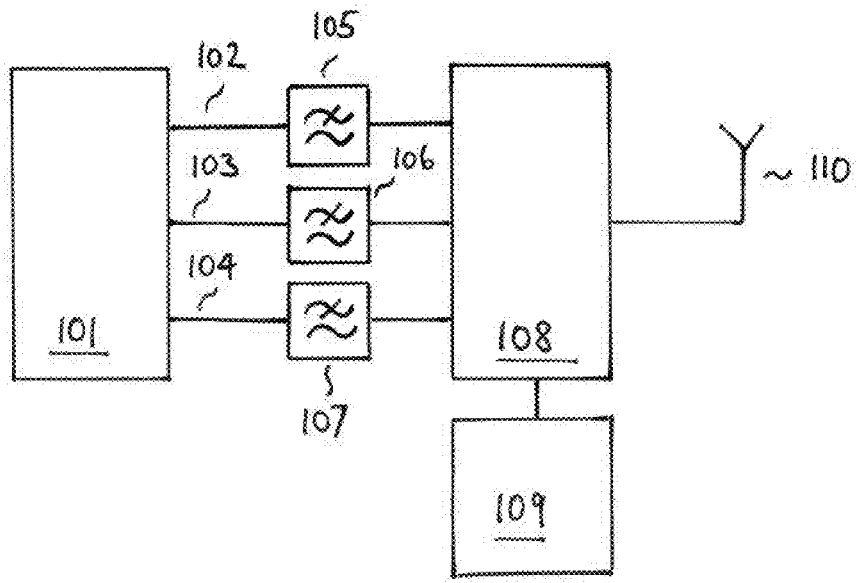
FIG. 1 is a block diagram of an implementation of a system having a modulator.

FIG. 1 illustrates an exemplary system of a transmission type device having a modulator. The transmission device includes a baseband unit 101 that provides data to be transmitted in the form of a digital word that comprises one or more bits. The data is provided to a digital interface that includes the first signal line 102, a second signal line 103, and a third signal line 104. Each signal line provides a bit of the digital word. The first signal line 102 to a first low-pass filter 105 provides the bit. An output of the first low-pass filter 105 is provided to a modulator unit 108. A bit is provided by the second signal line 103 to a second low-pass filter 106. An output of the second low-pass filter 106 is provided to the modulator unit 108. A bit is provided that by a third signal line 105 to a third low-pass filter 107. An output of the third low-pass filter 107 is provided to the modulator unit 108.

In various embodiments, any suitable number of signal lines and/or low-pass filters may be used to provide more or fewer bits to the digital word to the modulator unit 108. In one embodiment, the total number of bits depends on the size of the digital word. In one embodiment the digital word has the size of six bits or one byte. In various embodiments, the size is defined by the accuracy needed to transmit information.

The modulator is arranged to modulate information onto a carrier frequency signal in order to provide the transmission signal of the transmission unit. In various embodiments, the modulator unit 108 may include digital-to-analog converter unit (DAC) to convert the digital word provided by the baseband unit 101 into analog information. The DAC may be an r-string or current steering DAC or any other suitable implementation of a digital-to-analog converter. An output signal of the DAC is provided to a resistor-capacitor (RC) filter. The output of the RC filters is converted into a current by a voltage/current converter. The current is supplied to a source of a multiplexer based differential up conversion mixer pair. The modulator further includes a local oscillator (LO). The local oscillator may be any frequency generator that generates a local oscillation signal or frequency signal. The frequency signal chosen to be at the desired radio frequency of the transmission unit. The frequency signal is further set into gates of the mixer pair so to mix the LO signal with the output of the RC filter.

In various embodiments, the frequency synthesizer 109 shown in the implementation may comprise a phase locked loop (PLL), a voltage controlled oscillator (VCO), or a ring oscillator etc. In other embodiments, frequency synthesizer 109 may comprise a phase synthesizer, an implementation of an analog PLL or a digital PLL.

Any other output medium such as a contact to a wireline access may be arranged. The transmitter may in various embodiments be used in wireless, wireline, cordless, or radio data transmission applications. Therefore in various embodiments, the output medium may be a coupler or a contact connectable to a copper wire or an optical wafer.

Figure 2:
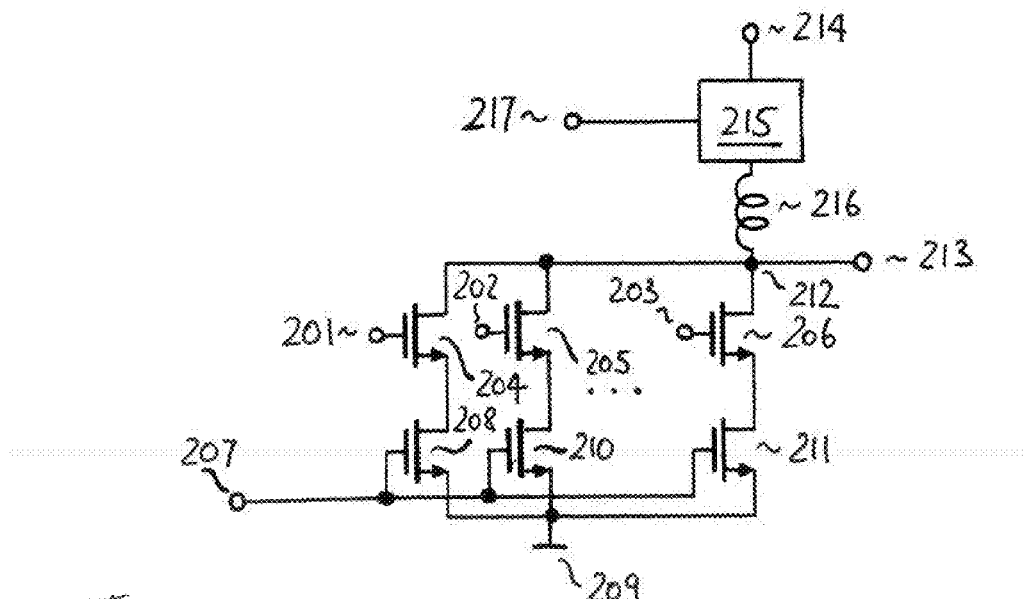
FIG. 2 is a block diagram of an implementation of a transmitter that comprises an RF DAC.

FIG. 2 shows an implementation of an RF DAC. The RF DAC has the first input 201, the second input 202 and a third input 203 that receive different bit of the digital work produced by the baseband unit. The first input 201 couples to a gate terminal of a first switching transistor 204. The second input 202 couples to a gate terminal of a second switching transistor 205. The third input 203 couples to a gate terminal of a third switching transistor 206. The RF DAC further has a fourth input 207 to receive local oscillator signal. The fourth input 207 couples to a gate terminal of a fourth switching transistor 208. A drain terminal of the fourth switching transistor 208 is coupled to a source terminal of the first switching transistor 204. The source terminal of the fourth switching transistor 208 couples to a ground terminal 209. The fourth input 207 further couples to a gate terminal of a fifth switching transistor 210. A grain terminal of the fifth switching transistor 210 couples to a source terminal of the second switching transistor 205. Again a source terminal of the fifth switching transistor 210 couples to the ground terminal 209. The fourth input 207 further couples to a gate terminal of a sixth switching transistor 211. A drain terminal of the sixth switching transistor 211 couples to a source terminal of the third switching transistor 206. The source terminal of the sixth switching transistor 211 couples to the ground terminal 209. The drain terminals of the first switching transistor 204, the second switching transistor 205 and a third switching transistor 206 are connected to each other at a first knot 212. The first knot 212 couples to output 213 of the modulator. The first knot 212 further couples to a power supply circuitry of the modulator. The power supply circuitry comprises power supply voltage input 214. The power supply input 214 receives a power supply voltage. The power supply input 214 is coupled to the first knot 212 via a series DC/DC converter 215 and an inductor 216. The DC/DC converter 215 couples to control signal input 217. The control input 217 receives a control signal, which is used to control an operational state of the DC/DC converter 215. The control signal may be a signal such as programmable gain control (PGC) signal.

The architecture of the modulator relies on a concept also known as RF DAC. The RF DAC comprises a set of current sources coupled in parallel which are formed by a first current source comprising the first switching transistor 204 and the fourth switching transistor 208. The second current source comprises the second switching transistor 205 and the fifth switching transistor 210, and so forth. Each current source has a switching transistor that receives a bit of the digital word representing the information to be transmitted. The bit serves s to either switch on the current source or to turn off the current source. Usually high potential representing (logic "1") turns on the current source. In various other embodiments, different implementations of the switching circuitry may be arranged. The second switching transistor 205 is controlled by the signal received at the fourth input 207. This signal may be high frequency signal such as provided by local oscillator of a transmitter. The various embodiments the high frequency signal may be a bit-like or a pulse width modulationr (PWM) signal. By means of that signal the second switching transistor 205 is turned on or turned off.

The current sources are designed that the current produced by each current source is in relation to the position of the bit in the digital word of the information to be transmitted. Then therefore the current sources may be designed so that a current provided by a current source is in a binary relation with respect to the current produced by another current source. This may be achieved by using switching transistors that have different channel properties as compared to the switching transistors used in other current sources of the modulator. The various currents produced by the current sources are added up at the first knot 212 to produce an output signal that is provided at the output 213. The output signal is comprising a frequency part contributed by the switching signal received at the fourth input 207. Furthermore, the current is dependent on the digital word fed into the first input 201, the second input 202, and the third input 203. The supply voltage fed into the power supply input 214 controls the complete amplitude of the output signal. The supply voltage is scaled by the DC/DC converter 215 independent of the control signal sent and received at the control input 217. The control signal may be a digital signal, such as a ptc signal. Therefore the shown modulator uses the full digital processing of the amplitude part of the output signal provided at the signal output 213. In case the control signal is a digital signal the digitally controlled DC/DC converter 215 can be adjusted on a predetermined value in order to achieve a maximum efficiency of the modulator, since the crest factor (PRR) of the output signal is known in advance and can easily be controlled by means of a digital signal. Since all transistors used in the modulators are used in a switching that is an exaggerated state, the current consumption may be easily adapted by means of the PGC signal as well as by means of the RF DAC architecture of the modulator, so that power supply is optimally adjusted and in consequence an overall higher efficiency of the modulator is achieved.

Figure 3:
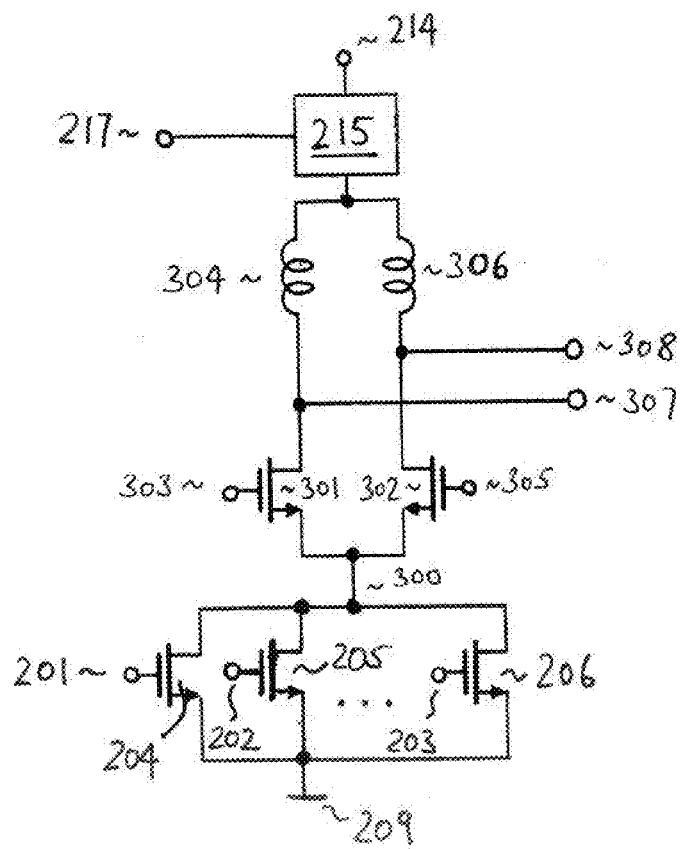
FIG. 3 is a block diagram of an implementation of a modulator.

FIG. 3 shows different implementation of a modulator. In contrast to the modulator described in FIG. 3 the modulator of the FIG. 3 shows a differential version of RF DAC. The modulator has a first input 201, a second input 202 and a third input 203 to receive a digital word to be modulated on a carrier frequency signal. The first input 201 connects to a first switching transistor 204. The second input 202 connects to a second switching transistor 205. The third input 203 connects to a third switching transistor 206. The source terminal of the first switching transistor 204, source terminal of the second switching transistor 205, and source terminal of the third switching transistor 206 coupled to a ground terminal 209. The drain terminal of the first switching transistor 204, a drain terminal of the second switching transistor 205, and a drain terminal of the third switching transistor 206 couple to a first knot 300. Additional switching transistors and inputs connected to a gate terminal of the switching transistors may be provided so to receive a digital word having plurality of bits higher than 3. This is indicated by three dots in the FIG. 3. The switching transistors may be having channel widths related to each other in dependence of the position of the respective bit received by the receptor respective input of the gate terminal depending on the position of the bit in the digital word. The first switching transistor 204 the second switching transistor 205, and the third switching transistor 206 search are thus arranged to provide a current source generating a current independency of a digital word fed into the first input 201, the second input 202, and the third input 203. The current is provided at the first knot 300. The first knot 300 coupled to a source terminal of a first mixing transistor 301 and to a source terminal of a second mixing transistor 302. A gate terminal of the first mixing transistor 301 couples to a first low oscillator signal input 303. The drain terminal of the first mixing transistor 301 couples by a first inductance 304 to a DC/DC converter 215.

A gate terminal of the second mixing transistor 302, couples to a second local oscillator signal input 305. The drain terminal of the second mixing transistor 302 couples via the second inductance 306 to the DC/DC converter 215. The DC/DC converter 215 provides supply voltage to the mixing circuitry of the modulator. The drain terminal of the first mixing transistor 301 couples to a first output 307 and the drain terminal of the second mixing transistor 302 couples to a second output 308.

The DC/DC converter 215 provides the supply voltage of the modulator independency of a programmable gain control signal received at gain control input 217 and global supply voltage received at a supply voltage input 214 in an analogous manner to the circuitry described with respect to FIG. 2. The first local oscillator signal input 303 receives local oscillator signal provided by a local oscillator, such as a VCO, PLL, or any other circuitry providing local oscillator signal. The second local oscillator signal 305 receives inversed version of the local oscillator signal. The output signal is provided in differential form in the first output 307 and the second output 308. Modulation is achieved by controlling the current source of the mixing circuitry by means of a digital word received at the first input 201, the second input 202, and the third input 203. The modulator of FIG. 3 represents a differential version of an RF DAC. The transistors shown in the circuitry are usually operated in saturation mode yet depending on different implementations of the embodiment they may also be operated in a linear mode.

Figure 4:
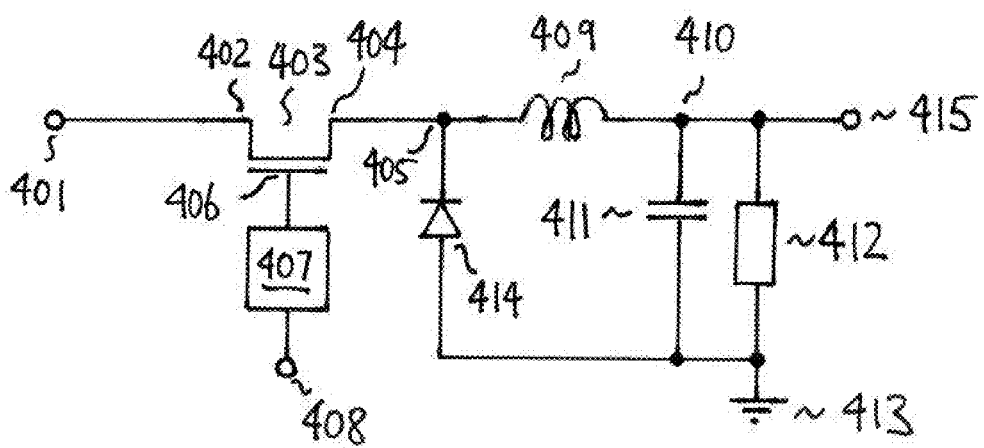
FIG. 4 is a block diagram of an implementation of a switched mode DC/DC converter.

FIG. 4 is a block diagram of an implementation of a switched mode DC/DC converter. It has a voltage input 401 to receive a constant input voltage, e.g. a battery voltage or a derivative thereof. The constant input voltage may be provided by a voltage regulator, such as a Power Management Unit that may provide a timely constant voltage of a battery voltage, irrespectively of a charging state of the battery.

The input 401 couples to a first terminal 402 of a transistor 403. A second terminal 404 of the transistor 403 couples to a first knot 405. The transistor 403 further has a control terminal 406 that couples via a control unit 407 to a control input 408. The control input 408 receives a control signal, such as a Programmable Gain Control (PGC) signal provided by other circuitry in a transmitter comprising a modulator or by external circuitry. The PGC signal includes information on a the amplitude part of the output signal, so it indicates when and how much output amplitude should be reduced and what Crest factor, i.e which ratio between power and amplitude (Power-Amplitude Ratio, or PAR) should be achieved.

The control signal is converted by means of the control unit 407 into a switching signal controlling the gate terminal 406. The control unit 407 may be implemented as Pulse-Width Modulator (PWM), as Sigma-Delta Modulator or any other suitable signal modulator providing a rectangular pulse signal.

In one embodiment, the transistor 403 is implemented in a CMOS technology, the first terminal 402 and the second terminal 404 respectively correspond to one of a source and a drain terminal of the transistor 403. The control terminal 406 corresponds to a gate terminal. The transistor 403 operates in a saturated mode. In case the control unit 407 provides a pulse to the control terminal 406, thus the source-drain path of transistor 403 opens and the input voltage 401 is provided at the first knot 405. In all other cases, the source-drain path is closed.

The first knot 405 couples via an inductor 409 to a second knot 410. The second knot 409 couples via a capacitor 411 and resistor 412 in parallel to a ground terminal 413. The ground terminal 413 couples via a rectifying diode 414 to the first knot 405.

The DC/DC converter shown in FIG. 4 is a digitally controlled boost converter. Yet, in any other suitable converter architecture, e.g. buck converters, converters including a transformer, etc may be applicable in combination with a modulator. The disclosed system makes use of a DC/DC converter to adjust optimally power supplied to transistors included in a modulator, such as shown in FIG. 1. Based on information, such as the PGC signal, the DC/DC converter is adjusted to an output voltage so to achieve maximum efficiency. This may be additionally improved by operating the transistors included in the modulator in saturated mode thus inherently using adaptive power consumption of the modulator. In consequence, an overall high efficiency is provided. In various embodiments, the systems is applied to a deep submicron CMOS process.

CONCLUSION

Although embodiments for power amplifier with output power control have been described in language specific to structural features and/or methods, it is to be understood that the appended claims are not necessarily limited to the specific features or methods described. Rather, the specific features and methods are disclosed as exemplary implementations for High Efficiency Modulation

What is claimed is:

1. A modulation device, comprising:
   a modulator to receive a useful signal and a carrier signal and to provide an output signal;
   a voltage regulator to receive a supply voltage and a control signal and to provide a second supply voltage to the modulator, the control signal at least based on one or more attributes of the output signal of the modulator.

2. The modulation device according to claim 1, wherein the voltage regulator comprises a DC/DC converter.

3. The modulation device according to claim 2, wherein the DC/DC converter is a switched mode DC/DC converter.

4. The modulation device according to claim 2, wherein the DC/DC converter is digitally controlled.

5. The modulation device according to claim 1, wherein the control signal is a programmable gain control (PGC) signal.

6. The modulation device according to claim 1, wherein the modulator comprises an RF Digital-to-Analog Converter (DAC).

7. The modulation device according to claim 1, wherein the modulator comprises a LIN Converter (LINC).

8. The modulation device according to claim 1, wherein the modulator comprises a Cartesian modulator.

9. The modulation device according to claim 1, wherein the modulatory comprises a plurality of transistors to modulate the useful information on the carrier signal.

10. The modulation device according to claim 9, wherein the plurality of transistors configured to operate in a saturated mode.

11. The modulation device according to claim 1, wherein the at least one or more attributes includes information related to a crest factor of the output signal.

12. The modulation device according to claim 1, wherein the at least one or more attributes includes information related to an amplitude part of the output signal.

13. A transmitter, comprising:
   an RF DAC having a plurality of transistors configured to operate in a saturated mode;
   an adaptive supply voltage generator to provide a supply voltage to the RF DAC; and
   an input to receive a programmable gain control (PGC) signal that couples to the adaptive supply voltage generator;
   wherein the adaptive supply voltage generator is controlled by the programmable gain control (PGC) signal.

14. An apparatus, comprising:
a digital modulator to provide an output signal;
a voltage regulator to receive a control signal and to provide a voltage to the digital modulator, the control signal at least based on one or more attributes of the output signal of the modulator.

15. The apparatus according to claim 14, wherein the at least one or more attributes includes information related to a crest factor of the output signal.

16. The apparatus according to claim 14, wherein the at least one or more attributes includes information related to an amplitude part of the output signal.

17. The apparatus according to claim 14, wherein the control signal is a programmable gain control (PGC) signal.

18. The apparatus according to claim 14, wherein the a digital modulator includes an RF DAC.

* * * * *